(12) United States Patent
Thomas et al.

(10) Patent No.: US 8,314,453 B2
(45) Date of Patent: Nov. 20, 2012

(54) SRAM MEMORY CELL WITH FOUR TRANSISTORS PROVIDED WITH A COUNTER-ELECTRODE

(75) Inventors: Olivier Thomas, Revel (FR); Claire Fenouillet-Béranger, Saint Martin d'Hères (FR); Philippe Coronel, Barraux (FR); Stéphane Denorme, Crolles (FR)

(73) Assignees: Commissariat a l'Energie Atomique et aux Energies Alternatives, Paris (FR); STMicroelectronics (Crolles 2) SAS, Crolles (FR)

( * ) Notice: Subject to any disclaimer, the term of this patent is extended or adjusted under 35 U.S.C. 154(b) by 0 days.

(21) Appl. No.: 13/073,259

(22) Filed: Mar. 28, 2011

(65) Prior Publication Data
US 2011/0291199 A1    Dec. 1, 2011

(30) Foreign Application Priority Data

Mar. 26, 2010  (FR) .................................... 10 01214

(51) Int. Cl.
*H01L 29/76* (2006.01)
*G11C 11/34* (2006.01)
(52) U.S. Cl. ............ 257/314; 257/E27.098; 365/185.05
(58) Field of Classification Search .................. 257/369, 257/390, E27.06, E27.062, 314, 315, 326, 257/E27.098; 365/102, 156, 154, 185.05, 365/185.07
See application file for complete search history.

(56) References Cited

U.S. PATENT DOCUMENTS

| | | |
|---|---|---|
| 2003/0090924 A1 | 5/2003 | Nii |
| 2009/0129142 A1 | 5/2009 | Yamaoka et al. |

FOREIGN PATENT DOCUMENTS

| | | |
|---|---|---|
| EP | 1 465 200 A1 | 10/2004 |
| FR | 2 944 139 A1 | 10/2010 |
| WO | WO 2010/112585 A1 | 10/2010 |

*Primary Examiner* — Matthew Reames
*Assistant Examiner* — Nikolay Yushin
(74) *Attorney, Agent, or Firm* — Oliff & Berridge, PLC (57) ABSTRACT

The memory cell is of SRAM type with four transistors provided with a counter-electrode. It comprises a first area made from semiconductor material with a first transfer transistor and a first driver transistor connected in series, their common terminal defining a first electric node. A second transfer transistor and a second driver transistor are connected in series on a second area made from semiconductor material and their common terminal defines a second electric node. The support substrate comprises first and second counter-electrodes. The first and second counter-electrodes are located respectively facing the first and second semiconductor material areas. The first transfer transistor and second driver transistor are on a first side of a plane passing through the first and second electric nodes whereas the first driver transistor and second transfer transistor are on the other side of the plane.

15 Claims, 4 Drawing Sheets

SRAM MEMORY CELL WITH FOUR TRANSISTORS PROVIDED WITH A COUNTER-ELECTRODE

BACKGROUND OF THE INVENTION

The invention relates to an SRAM memory cell with four transistors provided with a counter-electrode.

STATE OF THE ART

Over the last few years, the electrical characteristics of transistors on bulk silicon substrate have suffered a downturn with the accentuation of parasite effects linked to the reduction of size. These modifications of the transistor behavior have a great influence on operation of memory cells then making this operation less rugged. At the same time, the conventional SRAM (Static Random Access Memory) memory cell comprising six transistors (four NMOS and two PMOS) occupies too large a surface in integrated circuits. In order to reduce the importance of these drawbacks, new architectures are making their appearance and should enable memory cells to be produced that occupy less surface area, while at the same time being rugged in operation.

For a given technological node, reduction of the surface area of the cell is mainly linked to a reduction of the number of transistors. Numerous memory cells comprising only four or five transistors are currently proposed. These cells are generally connected to a word line and to two bit lines.

Certain architectures have led to memory cells of loadless type wherein the load transistors have been eliminated. In other cases the two driver transistors have been eliminated and a memory cell of driverless type is then obtained.

In general manner, memory cells with four transistors are not sufficiently stable to guarantee satisfactory operation on account of the variations of the fabrication process. In particular, the loadless SRAM type memory cell comprising four transistors is very sensitive to the differences in the electric performances of the transistors of the cell and to temperature increases. These two points generally lead to the use of additional compensation circuits thereby greatly reducing the gain in surface area obtained by eliminating transistors from the cell.

Figure 1:
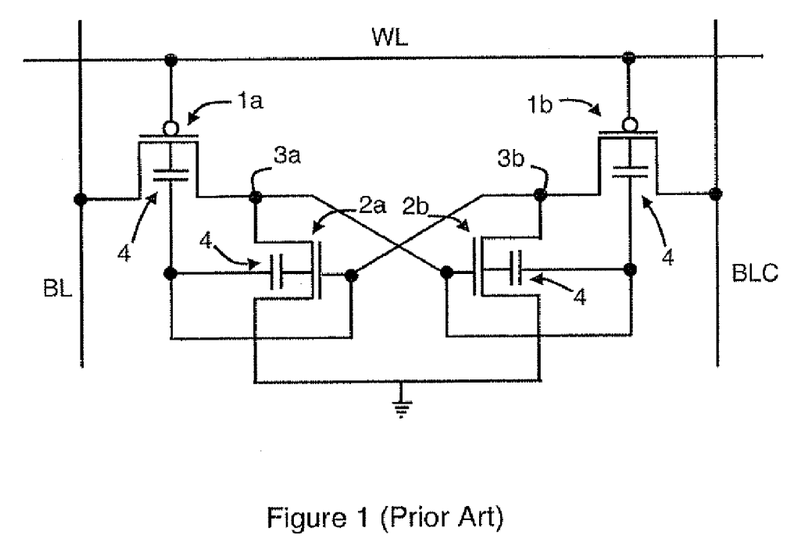
FIG. 1 represents a memory cell with four transistors with counter-electrodes according to the prior art, from an electric point of view, FIGS. 2 and 3 schematically represent top views of the pattern of a memory cell according to the prior art at the level of the silicon-on-insulator layer and at the level of the support substrate, FIGS. 4 and 5 schematically represent top views of two alternative embodiments of a pattern of a memory cell at the level of the silicon-on-insulator layer.

However, the use of dual-gate transistors in an SRAM memory cell with four transistors improves the electric behaviour and brings the performances of this cell up close to those of a six-transistor cell. Such a memory cell is described in the document US2009/0129142. As illustrated in FIG. 1, the memory cell comprises two transfer transistors for access 1a, 1b and two driver transistors 2a, 2b. The transfer transistors 1 of pMOS type are each connected in series to a driver transistor 2 of nMOS type between a bit line BL, BLC and ground GND. The source/drain electrode common to a transfer transistor and a driver transistor defines an electric node 3a, 3b which is connected to the gate electrode of the opposite driver transistor and to the counter-electrodes 4 of the opposite transfer and driver transistors.

By means of this electric assembly, a four-transistor memory cell can be obtained that is more compact than a six-transistor memory cell and that presents interesting performances.

However, although the electric layout appears fairly simple, the presence of four counter-electrodes within the memory cell makes this cell complex to produce. The transistors provided with a counter-electrode are silicon-on-insulator transistors in which the support substrate comprises a highly electrically conducting area which forms the counter-electrode.

Figure 2:
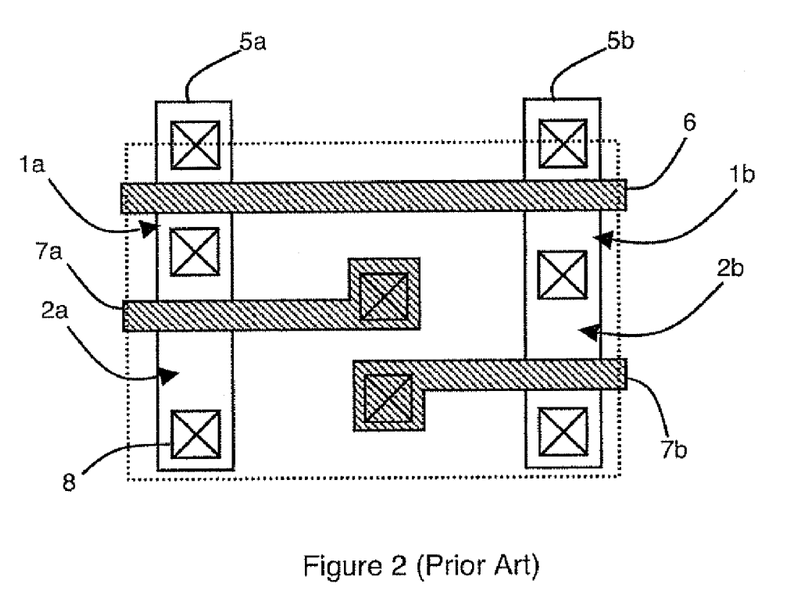

As illustrated in FIG. 2, the silicon-on-insulator layer is patterned so as to form two identical rectangular active areas 5a, 5b facing one another. On each of these active areas 5, a transfer transistor 1 and driver transistor 2 are integrated to be connected in series. Transfer transistors 1 are connected on the top part of active area 5 whereas driver transistors 2 are connected on the bottom part of active area 5 of FIG. 2.

A common gate electrode 6 is produced to form transfer transistors 1. Two distinct gate electrodes 7a, 7b are formed to define driver transistors 2. Vertical electric contacts 8, conducting vias, are formed on the electrodes to enable electric connection thereof by means of upper interconnection levels (not shown). These contacts 8 schematically represent the source/drain electrodes of transistors 1 and 2 of active areas 5 and the area of gate electrode 7 that is used for the electric connections.

Figure 3:
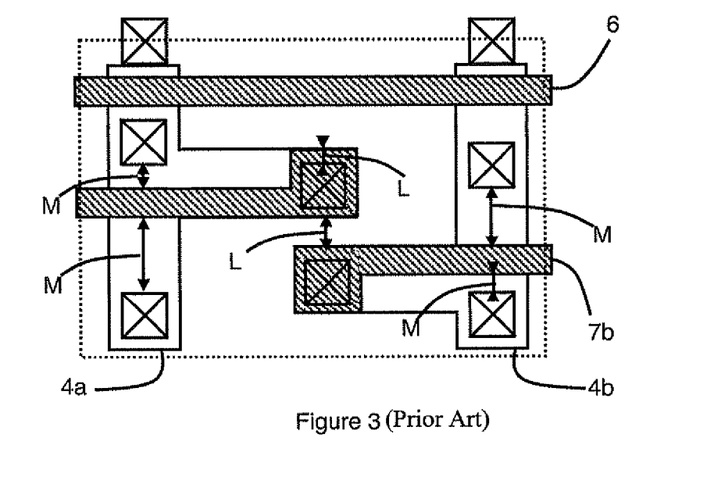

As illustrated in FIG. 3, counter-electrodes 4 are formed underneath active areas 5 in the support substrate. In addition to the pattern of rectangular active area 5, counter-electrodes 4 present an excrescence that extends underneath gate electrode 7 so as to enable electric connection of gate electrode 7 with counter-electrode 4.

Once the transistors have been produced, gate and source/drain contacts 8 are formed. Then the metal interconnection levels are formed to finalize the memory cell and obtain the required electric connections between the different electrodes.

From an electric point of view, this memory cell presents numerous advantages, but its operation remains imperfect and its fabrication method is difficult to perform on an industrial scale.

SUMMARY OF THE INVENTION

The object of the invention is to provide a memory cell that is more compact than the memory cell of the prior art without increasing the complexity of the fabrication method.

To meet this requirement, a device is in particular provided which comprises:
  a first area made from semiconductor material with a first transfer transistor and a first driver transistor connected in series, their common terminal defining a first electric node,
  a second area made from semiconductor material with a second transfer transistor and a second driver transistor connected in series, their common terminal defining a second electric node,
  a support substrate with first and second counter-electrodes, the first and second counter-electrodes being located respectively overlapping the first and second areas made from semiconductor material,
  the first transfer transistor and second driver transistor are on a first side of a plane passing via the first and second electric nodes and the first driver transistor and second transfer transistor are on the other side of said plane,
  the connections of the counter-electrode and of the associated gate electrode are located on each side of said plane.

BRIEF DESCRIPTION OF THE DRAWINGS

Other advantages and features will become more clearly apparent from the following description of particular embodiments of the invention given for non-restrictive example purposes only and represented in the appended drawings, in which.

DESCRIPTION OF A PREFERRED EMBODIMENT OF THE INVENTION

Figure 4A:
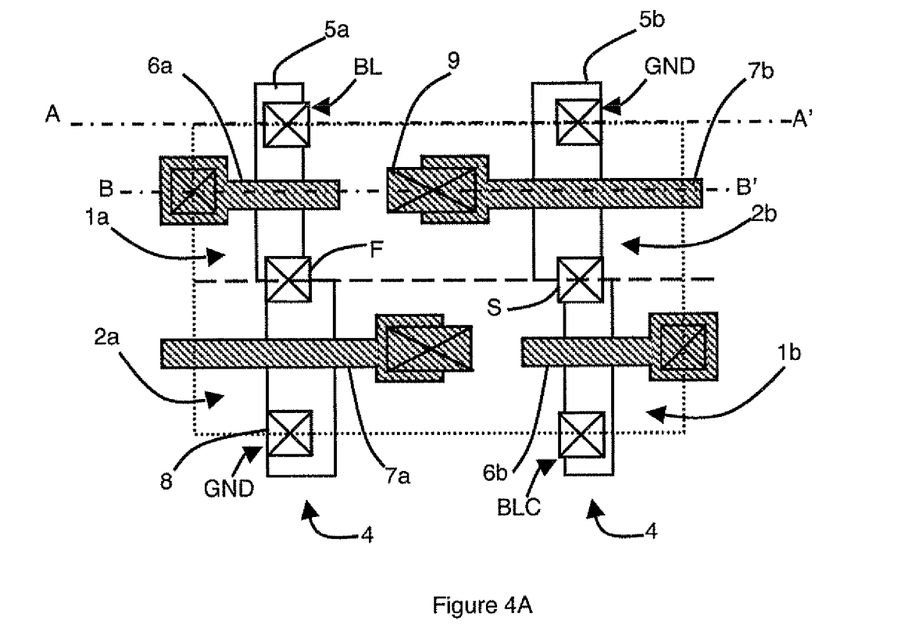
Figure 4B:
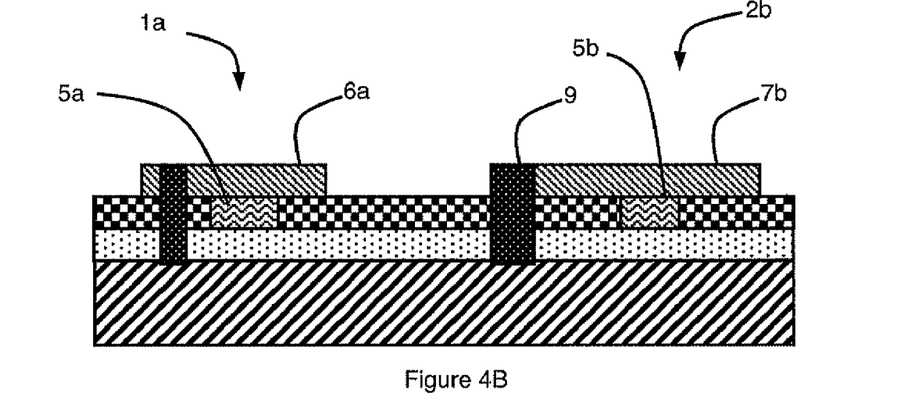

As illustrated in FIG. 4, the SRAM memory cell comprises four transistors, two transfer transistors 1a, 1b and two driver transistors 2a, 2b. A transfer transistor 1 is connected in series with a driver transistor 2 between a bit line BL, BLC and a predefined voltage such as ground GND or the cell supply voltage Vdd.

The memory cell therefore comprises two pairs of transistors connected in series. Each of these pairs of transistors is formed by an active area 5, i.e. an area made from semiconductor material which is electrically insulated from the other active area and from the support substrate. Transfer transistors 1 are both connected to a bit line BL, BLC and driver transistors 2 are both connected to ground GND or to voltage Vdd via one of their source/drain electrodes, for example via a source/drain contact 8.

In this way, first active area 5a, for example the active area situated on the left in FIG. 4, comprises first transfer transistor 1a and driver transistor 2a. First transfer transistor 1a is connected in series with first driver transistor 2a by means of their source and drain electrodes. These two transistors therefore have a common electrode i.e. a part of the volume of the semiconductor material area which forms a first electric node F. They advantageously have a common contact 8.

In like manner, second active area 5b, for example the active area situated on the right of FIG. 4, comprises second transfer transistor 1b and driver transistor 2b. Second transfer transistor 1b is connected in series with second driver transistor 2b by means of their source and drain electrodes. These two transistors therefore have a common electrode i.e. a part of the volume of the semiconductor material area which forms a second electric node S. They advantageously have a common contact 8.

Transfer transistors 1 are of a first conductivity type, for example pMOS transistors, and driver transistors 2 are of a second conductivity type which is the opposite of the first conductivity type, for example nMOS transistors. It is possible to change the conductivity of driver transistors 2 and transfer transistors 1 provided that they present opposite types of conductivity.

Transfer transistors 1 and driver transistors 2 are of semiconductor-on-insulator type with a counter-electrode 4, which means that they are produced on a substrate which successively comprises a support substrate, a layer of electrically insulating material, and a layer of semiconductor material. The first and second active areas made from semiconductor material 5 are formed in the semiconductor material layer. These first and second active areas 5 are electrically insulated from one another by an electrically insulating pattern which separates them. This insulating pattern can be made by an electrically insulating material, for example a silicon oxide or a silicon nitride, or by etching of a part of the semiconductor material layer so that there is no longer any electric contact between these two areas 5.

In this way, first transfer transistor 1a and driver transistor 2a share the same active area, first active area 5a, i.e. the same volume of semiconductor material. As explained in the foregoing, they also share a source/drain electrode and preferably the associated contact 8, typically a via, a vertically oriented electric conductor.

In like manner, second transfer transistor 1b and driver transistor 2b share the same active area, second active area 5b, i.e. the same volume of semi-conductor material. They also share a source/drain electrode and preferably the associated contact 8, typically a via.

The memory cell comprises first and second counter-electrodes 4. First counter-electrode 4 is overlapping first active area 5a and second counter-electrode 4 is overlapping second active area 5b. The overlapping direction between a counter-electrode 4 and its associated active area 5 is vertical and these two elements are separated by an electrically insulating material. The first counter-electrode is common to the first transfer and driver transistors whereas the second counter-electrode is common to the second transfer and driver transistors.

In a particular embodiment which enables a good compactness of the memory so cell to be obtained, the first and advantageously second active areas 5 present an elongate shape. Elongate active area 5 is then oriented in a direction which passes via the distinct source/drain electrodes of the associated transfer and driver transistors. In an alternative embodiment, the source/drain contacts of transfer transistor 1 and driver transistor 2 of the same active area 5 are aligned.

First active area 5a and second active area 5b are parallel, i.e. they have parallel longitudinal axes. The longitudinal axis of active area 5 corresponds to the axis which passes through transfer transistor 1 and driver transistor 2 of an active area 5. The longitudinal axis corresponds to the axis which passes via source/drain contacts 8 of the two transistors. It is also an axis which is advantageously perpendicular to the longitudinal axis of the gate electrodes deposited on active area 5.

In a particular embodiment, it is conceivable to stray from this parallelism of the active areas and to accept a slight offset.

Figure 5A:
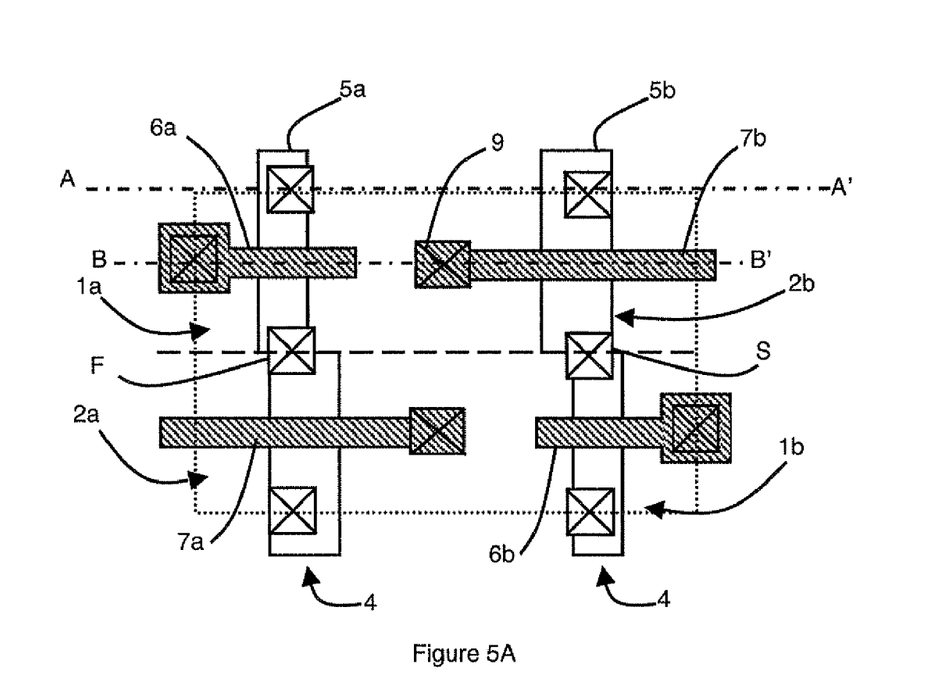
Figure 5B:
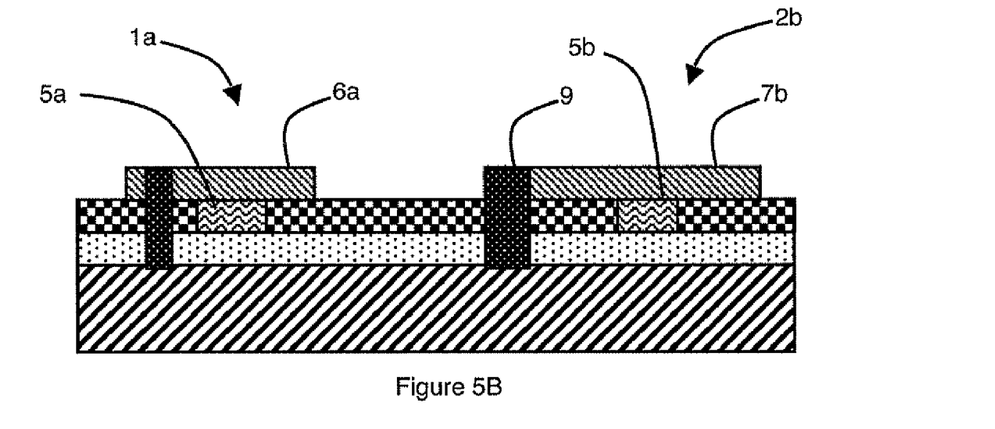

In an alternative embodiment illustrated in FIGS. 4 and 5, the width of active area 5 is not constant along its longitudinal axis. It is however constant or substantially constant for a given transistor. A width difference of active area 5 thereby exists between transfer transistor 1 and driver transistor 2. This width difference of active area 5 enables the effective width of the conduction channel of the transistor to be modified. In this way, it is possible to adjust the electric characteristics of transfer transistor 1 with respect to driver transistor 2. In a particular embodiment, active area 5 presents a longitudinal wall which is flat whereas the opposite wall presents a dogtooth, i.e. a step. In another embodiment, the two longitudinal walls each present a dogtooth. Depending on the design rules that can be used, this dogtooth ensures a good electric connection between the active area and the metal contact representative of the electrode. However, this dogtooth gives rise to an additional difficulty in control of the photolithography step involved in patterning of the active area. In one case, active area 5 presents a narrow area (the transfer transistor) comprised in the extension of a broad area (the driver transistor), preferably with a longitudinal axis of symmetry, whereas in the other case, the thinner part (the transfer transistor) is offset from the broader part (the driver transistor) as can be seen in FIGS. 4 and 5.

First active area 5a and second active area 5b are advantageously identical from the dimensional standpoint. They have the same length and the same width and present the same width variations when the latter exist. In so far as they originate from the same semiconductor material layer, the two active areas 5 also present the same thickness. It is considered that the dimensions are identical so long as the dimensional variations remain within the range of variations linked to drifts in the fabrication method. The parameters being identical, it is therefore easier to model operation of the structure and it is also easier to form the structure, for example the charge effects of the different methods are identical and the variations of all the devices will therefore be of substantially the same order of magnitude.

The first set of transistors formed by first driver transistor 2a and first transfer transistor 1a is facing the second set of transistors formed by second driver transistor 2b and second transfer transistor 1b. The same is therefore true of the first and second active areas in so far as they have the same length and both comprise a set of transistors.

Axis AA' which joins source/drain contact 8 connected to a bit line BL of a first active area and source/drain contact 8 connected to a preset potential, here ground GND, is advantageously parallel to longitudinal axis BB' of gate electrodes 6, 7. This enables a very compact memory cell to be achieved as the safety margins are reduced. Likewise, it is advantageous for the longitudinal axis of active areas 5 to be perpendicular to axes AA' and BB'.

The first and second sets of transistors are connected head-to-tail, i.e. the alignment of the driver and transfer transistors is reversed. First transfer transistor 1a is thus facing second driver transistor 2b and first driver transistor 2a is facing second transfer transistor 1b. The facing direction is along axis BB'. Connection of the transfer and driver transistors respectively to the bit lines and to ground GND or voltage Vdd is not questioned. This head-to-tail organization of the two sets of transistors results in a gain in compactness in the memory cell compared with the cell of the prior art. In other words, with respect to a plane FS perpendicular to the substrate passing via first electric node F and second electric node S, first transfer transistor 1a and second driver transistor 2b are on a first side of this plane whereas second transfer transistor 1b and first driver transistor 2a are on the other side of this plane FS. The connections of counter-electrode 4 and of associated gate electrode 7 are advantageously arranged on each side of said plane FS so as to preserve a compact structure.

Indeed, a driver transistor 2 is associated with a counter-electrode 4 and this counter-electrode 4 has to present a salient part to facilitate contact being made with a gate electrode. To prevent problems of short-circuiting between counter-electrodes 4, it is important for safety margins to be respected in design of the different electrodes. In the prior-art architecture, safety margins L are added together to ensure connection between the gate electrode of driver transistor 2 and its associated counter-electrode to prevent short-circuits. Safety margins M to be taken into account to prevent short-circuiting between gate electrode 7 of the driver transistor and source/drain contacts 8 associated with this transistor also exist. However, by placing a driver transistor 2 facing a transfer transistor 1, the safety margins between the gate electrode and the source/drain contact and the safety margins between the two counter-electrodes are on the other hand not added to one another.

Each transistor comprises a gate electrode 6, 7, a first part whereof, the narrow part, serves the purposes of defining the length of the conduction channel in the semiconductor material layer and a second part whereof, the broad part, serves the purposes of positioning the gate contact (FIG. 4). It is thereby possible to use a gate contact that is broader than the length of the conduction channel. However, in particular cases, only the narrow part of gate 7 is formed for the driver transistors (FIG. 5). This particular case can also be envisaged for the transfer transistors.

In a privileged embodiment illustrated in FIGS. 4 and 5, gate contacts 9 of first transfer transistor 1a and of second driver transistor 2b are oriented in a first lateral direction, i.e. the gate heads, the broad gate parts or a part that contains contacts 9, are both positioned on the same side of their respective active area (with respect to the longitudinal axis of the active area), for example on the left of the corresponding active area. On the contrary, gate contacts 9 of the second transfer transistor and of the first driver transistor are oriented in a second lateral direction which is opposite to the first lateral direction, i.e. the gate heads are positioned on the same side of their respective active area, for example on the right of the corresponding active area. This results in the gate heads of driver transistors 2 or the gate heads of transfer transistors 1 being formed between the two active areas 5. In very advantageous manner, the gate heads of driver transistors 2 are located between the active areas which enables the surface of the memory cell to be reduced. When there is not a broad gate head for a gate electrode 7, most of the gate electrode of a driver transistor is formed between the two active areas. In other words, the gate electrode contacts of driver transistor 2 and of transfer transistor 1 of one and the same active area 5 are located on each side of their active area 5.

In also advantageous manner, the gate electrodes of first transfer transistor 1a and of second driver transistor 2b are aligned. In like manner, the gate electrodes of second transfer transistor 1b and of first driver transistor 2a are also aligned (FIGS. 4 and 5). The longitudinal axes are identical and therefore aligned for the facing driver and transfer transistors.

All the transistors are transistors with a back gate, i.e. transistors which each comprise two gate electrodes in addition to first and second source/drain electrodes and a conduction channel. In conventional manner, the two gate electrodes are arranged on each side of the conduction channel and define two opposite faces of the conduction channel. The gate electrodes are separated from the conduction channel by an electrically insulating material. The first gate electrode is formed by a gate material which is deposited on the semiconductor material layer and which is separated from this semiconductor material layer by a gate dielectric. The second gate electrode is formed by a portion of the support substrate which is separated from the semiconductor material layer by the insulating material layer. The electrically insulating materials which separate the channel (in general manner the active area) from a gate electrode or a gate counter-electrode can be identical but also different in composition and/or in thickness. The second gate electrode is commonly called counter-electrode. The counter-electrode is formed in conventional manner in the support substrate, for example by doping a part of the support substrate or by means of a metal. The surface of the counter-electrode corresponds substantially to that of the associated active area, but it can be broader or narrower, as it can be longer or shorter. It does however have to be at least overlapping the conduction channels of the transistors in order to have an electrostatic effect. Depending on the thickness of the semiconductor material containing active area 5, the second electrode (the counter-electrode) may not enable creation of a second channel. The counter-electrode only enables adjustment of the electrostatic control of the gate and thereby of the threshold voltage of the transistor.

In the memory cell, the counter-electrodes of the first transfer transistor and of the first driver transistor are common. It is therefore sufficient to form a single counter-electrode for these two transistors and a single counter-electrode contact connection. The same is the case for the second transfer and driver transistors which only require a single counter-electrode and a single counter-electrode contact connection. This contact connection is advantageously located in immediate proximity to the gate contact of the associated driver transistor in order to form the required memory cell with maximum compactness. Advantageously, the surface of the counter-electrode is identical to and overlapping that of the active area so that, in top view, neither of the two patterns overshoots from the other.

The first gate electrode and the counter-electrode of each driver transistor are electrically connected to one another so that they are subjected to the same signal and therefore to the same potential. As far as the transfer transistors are concerned, the first gate electrode and the counter-electrode are electrically dissociated.

To obtain a compact cell, a single vertical contact 9, i.e. a via, constitutes the electric connection between gate electrode 7 of the driver transistor and its counter-electrode 4. By placing transfer transistors 1 and driver transistors 2 head-to-tail between first and second active areas 5, the gate contacts are then located on each side of a line which passes through the two common source/drain electrodes of each set of transistors. To form the required memory cell, it is therefore no longer necessary to use two metal interconnection levels to form the memory cell, a single metal interconnection level is sufficient. The connections of counter-electrode 4 and of gate electrode 5 of the associated driver transistor are located on each side of the plane SF.

As illustrated in FIGS. 4 and 5, gate contact 9 of second driver transistor 2b is arranged in the top part of the memory cell, i.e. above plane SF. Connection of the gate contact to the opposite electric node (first electric node) can then be made without passing through plane SF. In like manner, the gate contact of the first driver transistor is arranged in the bottom part of the memory cell, i.e. below plane SF. It is then possible to connect the two electric nodes in preferably symmetric manner to their respective gate contacts (those of the other active area) in the same metal interconnection level.

This architecture enables a symmetric cell to be obtained which is a favorable element for obtaining a more rugged and more stable circuit, in particular as far as control of stray capacitances is concerned.

Different alternative embodiments can be envisaged to obtain availability of the counter-electrode contact in simple and compact manner.

In a first alternative embodiment, gate contact 9 presents a larger surface than the driver transistor gate head. By eliminating and protecting the semiconductor material layer and the insulating layer in the immediate proximity of the gate head, it is possible to achieve a common electric contact 9 between the counter-electrode and the associated gate electrode. It is then advantageous to use a gate contact 9 which presents a larger surface for driver transistor 2 than for transfer transistor 1 (FIG. 4).

In a second alternative embodiment, gate contact 9 is made through the gate head which results in the existence of a direct vertical electric contact 9 between the gate head and counter-electrode.

In a third alternative embodiment, a counter-electrode contact connection is made at the periphery of the active area. This counter-electrode contact connection is made over the whole height of the insulating layer and of the semiconductor material layer so as to allow a common contact with the counter-electrode by means of a metal via which covers the gate head and the gate contact connection.

In all the foregoing alternative embodiments, it is possible to produce a plurality of memory cells on the same substrate. As the different memory cells have an independent operation, it is of prime importance to ensure the electric integrity of each of the cells with respect to the others. When the counter-electrode is formed by doping of the semiconductor material support substrate, the insulating pattern which separates active areas 5 also separates the counter-electrodes. The thickness of the doped area in the support substrate is thereby smaller than the depression depth of the insulating pattern in the support substrate.

The counter-electrode is made by doping the support substrate in opposite manner to the doping existing in the substrate. Thus, if the substrate is P-doped, the counter-electrodes are formed by N-doped areas, or vice-versa. A P/N or N/P junction is then formed between the counter-electrode and substrate. It is also conceivable to form two areas of opposite doping in the substrate. The first doped area forms the counter-electrode and the second doped area electrically insulates the counter-electrode from the substrate by means of a P/N or N/P junction. Advantageously, the area presenting a doping of opposite type from that of the counter-electrode is biased so that the diode is reverse-biased. For example a P+ doped counter-electrode is associated with an N-doped well which is biased at voltage Vdd. This embodiment is advantageous as all the counter-electrodes can be produced using the same type of doping.

It is even more advantageous to form the counter-electrode with the same type of doping as the active area so as to ensure a very good electric conduction and a very great compactness of the structure linked to the absence of a specific photolithography level. In this way, first and second counter-electrodes 4 formed in areas of the support substrate doped by a first type of dopant are separated from one another and from the rest of the support substrate by an area doped with an opposite type of doping. First and second counter-electrodes 4 in the support substrate doped by a first type of dopant are thus separated from one another and from the rest of the support substrate by an area doped with an opposite type of doping.

In a fourth alternative embodiment, two memory cells are integrated. In this particular architecture, the first active area made from semiconductor material presents a different length from the second active area. The first and second active areas are completed by a third active area. The third active area is in the continuation of the second active area and facing the first active area. The device formed by the two memory cells corresponds substantially to the repetition of the first memory cell with respect to a plane of symmetry which is perpendicular to the surface of the semiconductor material layer and perpendicular to the longitudinal axis of the active areas. The first active area is extended without a break and then comprises two driver transistors and two transfer transistors. The second active area is transformed into the third active area. It is also possible to form a memory device which comprises a first semiconductor material area 5a provided with a plurality of driver transistors and transfer transistors.

In the first active area, depending on the configuration, the transfer transistors are located at the ends of the active area and the driver transistors are located in the centre or vice-versa. Although these four transistors are all associated with the same active area, a counter-electrode cannot be associated with more than one transfer transistor and one driver transistor. There are therefore two adjacent counter-electrodes located under the first active area. There is also a counter-electrode located under the second active area and a counter-electrode located under the third active area. Each counter-electrode is associated with the gate of the corresponding driver transistor. The arrangement of the transistors between one another is the same as that described in the foregoing in order to form two independent memory cells.

Naturally the two counter-electrodes formed on the rear surface of the same active area and associated with two different memory cells are electrically dissociated. This dissociation can be achieved by any suitable technique, for example by ensuring that an area of opposite doping exists between these two counter-electrodes or by integrating an additional insulating pattern under the active area between the two counter-electrodes.

In yet another alternative embodiment, the first and second memory cells are achieved by means of the first and second active areas by making the same repetition as before via a plane of symmetry. In this embodiment there is no formation of a third active area but extension of the second active area. In like manner, it is possible to form a memory device comprising a plurality of memory cells by repeating the structure with a symmetry by a plane as explained in the foregoing. Advantageously, the plane of symmetry is located on the source/drain contact associated with a line Bit and/or on the source/drain contact associated with the ground or voltage Vdd (plane containing axis AA') so as to be more compact.

Formation of a memory device by means of a matrix of memory cells can also be performed by repeating the base cell in a perpendicular direction, again with a symmetry via a plane. There again, it is advantageous to place the plane of symmetry on the gate contact of the transfer transistor if the latter is located outside the inter active area space of the base memory cell.

In a privileged embodiment, there exists a vertical axis of symmetry, i.e. an axis perpendicular to the surface of the support substrate, for the whole cell or for a part of the cell. Advantageously there exists an axis of symmetry as far as first and second active areas 5 are concerned and as far as the first and second counter-electrodes are concerned. This symmetry facilitates integration of the different elements as it ensures an identical repercussion of the different drifts of the fabrication method. It is also particularly advantageous to have a symmetry of the memory cell as it is easier to model operation thereof, as explained in the above.

When the memory cells are integrated in a matrix, the dopant well advantageously covers the whole of the matrix so as to electrically insulate the counter-electrodes. In this way, the counter-electrodes are insulated from one another and are insulated from the rest of the substrate (from the outside environment).

The invention claimed is:

1. An SRAM memory cell with four transistors provided with a counter-electrode comprising:
    a first area made from a semiconductor material wherein a first transfer transistor and a first driver transistor are connected in series by a first common terminal defining a first electric node,
    a second area made from the semiconductor material wherein a second transfer transistor and a second driver transistor are connected in series by a second common terminal defining a second electric node, the first transfer transistor and the second driver transistor are on a first side of a plane passing via the first and second electric nodes and the first driver transistor and second transfer transistor are on an other side of said plane,
    a support substrate separated from the first and the second areas by an insulating layer,
    first and second counter-electrodes formed in the support substrate, the first counter-electrode overlapping the first area and the second counter-electrode overlapping the second area,
    a first connection between the first counter-electrode and a gate of the first driver electrode,
    a second connection between the second counter-electrode and a gate of the second driver electrode, the second connection and the first connection being located on either side of an axis passing through the first and the second electric nodes.

2. The cell according to claim 1 wherein a gate contact of the first driver transistor presents a larger surface than a gate contact of the first transfer transistor.

3. The cell according to claim 1 comprising an axis of symmetry between the first and second semiconductor material areas and the first and second counter-electrodes.

4. The cell according to claim 1 wherein the first and second counter-electrodes in the support substrate are doped by a first type of dopant and are separated from one another and from the rest of the support substrate by an area doped with an opposite type of dopant.

5. A memory device incorporating a cell according to claim 1, wherein the first semiconductor material area comprises a plurality of driver transistors and transfer transistors.

6. The cell according to claim 1 wherein a gate electrode contact of the first driver transistor and a gate electrode contact of the first transfer transistor are located on either side of the first area.

7. The cell according to claim 6 wherein a gate electrode contact of the second driver transistor and a gate electrode contact of the second transfer transistor are located on either side of the second area.

8. The cell according to claim 1 wherein a longitudinal axis of a gate electrode of the first transfer transistor is aligned with a longitudinal axis of a gate electrode of the second driver transistor.

9. The cell according to claim 8 wherein a longitudinal axis of a gate electrode of the second transfer transistor is aligned with a longitudinal axis of a gate electrode of the first driver transistor.

10. The cell according to claim 1 wherein the first semiconductor material area has a first dimension associated with first the driver transistor and a second dimension associated with the first transfer transistor, the second dimension being different from the first dimension along the axis passing through the first and the second electric nodes.

11. The cell according to claim 10 wherein the first width is longer than the second width.

12. The cell according to claim 10 wherein the first semiconductor material area presents a dogtooth in a first longitudinal wall between the first transfer transistor and the first driver transistor.

13. An SRAM memory cell with four transistors provided with a counter-electrode comprising:
    a substrate comprising successively a support substrate, an electrically insulating layer and a layer of semiconductor material,
    a first area made in the semiconductor material,
    a second area made in the semiconductor material,
    an electrically insulating pattern surrounding the first area and the second area,
    a first transfer transistor and a first driver transistor formed in the first area, each transistor having a first electrode and a second electrode made in the semiconductor material, the first electrode of the first transfer transistor and the first electrode of the first driver transistor being common so as to connect in series the first transfer transistor and the first driver transistor, the common electrode defining a first electric node, a second transfer transistor and a second driver transistor formed in the second area, each transistor having a first electrode and a second electrode made in the semiconductor material, the first electrode of the second transfer transistor and the first electrode of the second driver transistor being common so as to connect in series the second transfer transistor and the second driver transistor, the common electrode defining a second electric node, the first transfer transistor and second driver transistor are on a first side of a plane passing via the first and second electric nodes and the first driver transistor and second transfer transistor are on an other side of said plane, a first counter-electrode made in the support substrate, the first counter-electrode overlapping the first area made from semiconductor material, a first contact connecting the first counter-electrode with a gate electrode of the first driver transistor, a second counter-electrode made in the support substrate, the second counter-electrode overlapping the second area made from semiconductor material, a second contact connecting the second counter-electrode with a gate of the second driver transistor, the first contact and the second contact are located from either side of the plane passing via the first and second electric nodes.

14. The cell according to claim 13 wherein the first contact and a gate contact of the first transfer transistor are located on either side of the first active area.

15. An SRAM memory cell with four transistors comprising:
a substrate comprising successively a support substrate, an electrically insulating layer and a layer of semiconductor material,
a first area made in the semiconductor material,
a second area made in the semiconductor material,
an electrically insulating pattern surrounding the first area and the second area,
a first inverter made of a first and a second transistors formed in the first area wherein the first transistor is a NMOS transistor and the second transistor is a PMOS transistor,
a second inverter made of a third and a fourth transistors formed in the first area wherein the third transistor is a NMOS transistor and the fourth transistor is a PMOS transistor,
a first axis passing through the first transistor and the fourth transistor,
a second axis passing through the second transistor and the third transistor, the second axis being parallel to the first axis,
a first counter-electrode made in the support substrate, the first counter-electrode overlapping the first inverter,
a first contact connecting the first counter-electrode with a gate electrode of the first or the second transistor,
a second counter-electrode made in the support substrate, the second counter-electrode overlapping the second inverter,
a second contact connecting the second counter-electrode with a gate of the third or the fourth transistor, the first contact and the second contact are located from either side of the plane passing via a centre of the first inverter and a centre of the second inverter.

* * * * *